United States Patent [19]

Wen

[11] 3,850,710

[45] Nov. 26, 1974

[54] METHOD OF MAKING A QUASI-MONOLITHIC INTEGRATED CIRCUIT STRUCTURE

[75] Inventor: Cheng Paul Wen, Trenton, N.J.

[73] Assignee: RCA Corporation, New York, N.Y.

[22] Filed: Nov. 6, 1972

[21] Appl. No.: 304,010

[52] U.S. Cl. .......................... 156/3, 29/589, 156/8, 156/17, 357/37

[51] Int. Cl. .......................... C23f 1/02, H01l 7/50

[58] Field of Search .............. 29/576, 583, 589–591; 156/3, 7, 8, 17; 317/234, 235; 148/175, 186

[56] References Cited

UNITED STATES PATENTS

| | | | |
|---|---|---|---|
| 3,416,224 | 12/1968 | Armstrong et al. | 156/17 X |
| 3,647,585 | 3/1972 | Fritzinger et al. | 156/17 |

*Primary Examiner*—William A. Powell
*Attorney, Agent, or Firm*—Edward J. Norton; Joseph D. Lazar; Donald E. Mahoney

[57] ABSTRACT

A method of making a quasi-monolithic integrated circuit structure is presented. The method allows the use of any semiconductor material in combination with any type of material chosen for insulation as well as heat transfer qualities. The method includes the steps of bonding a metallic layer to a block of insulating material which may be chosen to provide good insulating and good heat transfer qualities and bonding a metallic layer to a block of semiconductor material which has had conductivity regions formed therein. The two metallic layers are then bonded together to from the quasi-monolithic integrated circuit structure.

7 Claims, 6 Drawing Figures

METHOD OF MAKING A QUASI-MONOLITHIC INTEGRATED CIRCUIT STRUCTURE

BACKGROUND OF THE INVENTION

The invention herein disclosed was made in the course of or under a contract or subcontract thereunder with the Department of the Air Force.

The present invention relates to a method for making a quasi-monolithic integrated circuit structure.

Monolithic integration refers to a method of providing a plurality of devices upon a common piece of semiconductor material and is an advantageous method of making electronic devices and circuits because of the small space requirements of such integrated circuits, ease with which identical devices can be fabricated, complexity of functions available with such integrated circuits, ease of interconnecting such integrated circuits, ability to fabricate complete circuits in the same operation, and similarity of operating conditions on the devices within such monolithic integrated circuits.

Heretofore, the structure of monolithic integrated circuits has been severely limited by the requirement that the conductivity regions which comprise the active devices making up such integrated circuits had to be either grown epitaxially or diffused into the semiconductor substrate. Diffusion limits the choice of semiconductor substrate to that of which the active device is comprised and therefore severely restricts the choice of material for use as the substrate. Therefore, monolithic integrated circuit structures have been epitaxially grown upon a substrate. While the best quality of epitaxial growth will occur if the substrate material is chosen to be the same as the material which comprises the active device, this is not strictly necessary. There is some range of choice for a substrate material which has better thermal conduction and insulation qualities than the semiconductor material which makes up the active device. However, epitaxial crystal growth can only be accomplished on a substrate which is compatible with the particular epitaxial semiconductor material chosen. Thus, for example, a silicon semiconductor layer may typically be grown upon a sapphire substrate, because sapphire will support the epitaxial growth of silicon layers and sapphire has much better insulation qualities than does silicon. While neither sapphire nor any other dielectric substrate material in common use provides the high thermal conductivity qualities as well as the low loss insulation qualities which would exemplify an ideal substrate material, they have been chosen because they are compatible with the requirement for epitaxial growth and because they possess good low loss insulation qualities. This lack of a dielectric substrate material which has a high thermal conductivity as well as low loss insulation qualities has limited the use of monolithic integrated circuits in general, and, in particular, has limited microwave uses to those applications which have low power requirements.

SUMMARY OF THE INVENTION

The method of making a quasi-monolithic integrated circuit structure is presented which comprises the steps of providing at least one conductivity region upon a semiconductor substrate material, depositing a first metallized layer over the conductivity region, depositing a second metallized layer upon an insulating substrate material, and bonding the first metallized layer to the second metallized layer.

DETAILED DESCRIPTION

Figure 1:
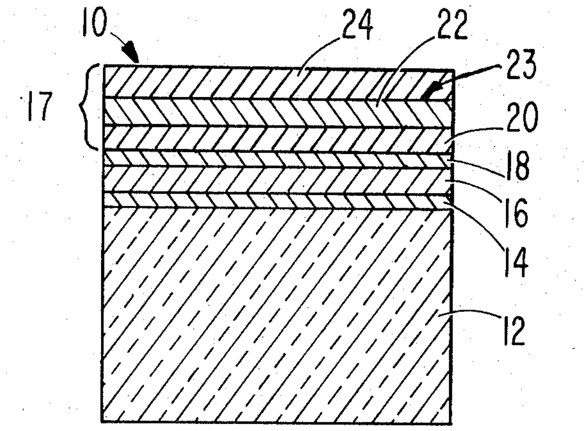
FIG. 1 is a sectional view of one embodiment of the quasi-monolithic integrated circuit structure made by the method of the present invention.

Referring generally to FIG. 1, a quasimonolithic integrated circuit structure 10 comprising an insulating substrate 12, metallic film layers 14, 16, 18 located directly above the insulating substrate 12, and a block of doped semiconductor material 17 having conductivity regions is shown. While the method shown may differ slightly when the invention is used to form such semiconductor devices as transistors or thyristors, the differences will be related to the formation of conductivity regions in the doped semiconductor material 17 and such differences will be in the number and conductivity type of regions within the block 17. In the preferred embodiment, there is a conductivity region 20 proximate metallic layer 18. This conductivity region 20 is doped to provide a low resistivity, less than about 0.01 ohm centimeter, and have an N+ type conductivity. There is also an intermediate region 22 of an N type conductivity and an upper conductivity region 24 doped to provide a P type conductivity and forming a PN junction 23 with the intermediate region 22. The preferred embodiment shown in FIG. 1 will be used as a basis for the construction of an IMPATT diode 26 shown in FIG. 2.

Figure 2:
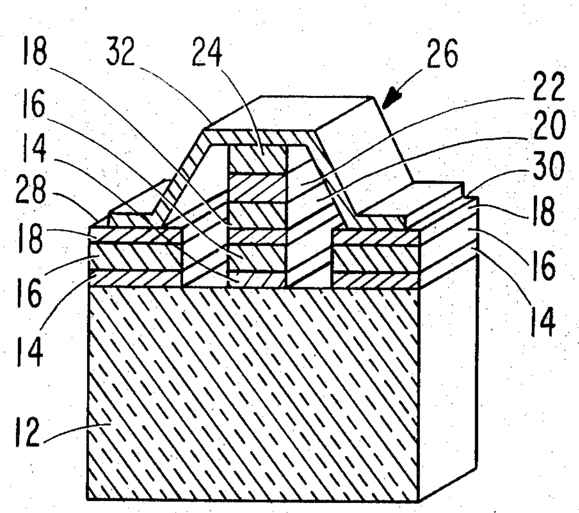
FIG. 2 is a perspective view of an IMPATT diode.

Referring generally to FIG. 2, an application of the quasi-monolithic integrated circuit structure 10 made by the method of the present invention is to build an IMPATT diode 26 for use in an IMPATT oscillator. For this purpose, the quasi-monolithic integrated circuit structure 10 is fabricated with N+ type doping in the conductivity region 20 adjacent the uppermost metallic film layer 18, N type doping in the intermediate conductivity region 22, and P type doping in the uppermost conductivity region 24 as shown in FIG. 1. The thickness of the N type intermediate conductivity region 22 is chosen to provide the correct transit time for the particular frequency at which the device is to be operated. Portions of the conductivity regions 20, 22, 24 and of the metallic film layers 14, 16, 18 are removed from the quasi-monolithic integrated circuit structure 10 by any commonly known method such as by etching. This may be achieved by standard photolithographic techniques by depositing resist material and by selectively etching those areas which are not protected by such resist material. This will leave an active device comprised of conductivity regions 20, 22, 24 which are bonded through metallic film layers 14, 16, 18 to the insulating substrate material 12. Other portions of the semiconductor conductivity regions 20, 22, 24 may be removed from the quasi-monolithic integrated circuit structure 10 leaving metallic layers 14, 16, 18 which may be used as ground planes 28, 30 in the IMPATT diode 26. A metallic strip 32 is then electrically connected between the ground planes 28, 30 and the uppermost P type conductivity region 24. The IMPATT diode 26 thus formed can be electrically connected in a circuit by attaching an electrode to one of the ground planes 28, 30 and another electrode to the uppermost metallic layer 18, as shown. As will be obvious to anyone skilled in the art, the connections to the IMPATT diode 26 may be etched directly into the metallic layers 14, 16, 18 without the use of discrete electrodes or interconnecting wires.

Some advantages of the IMPATT diode 26 made with the quasi-monolithic integrated circuit structure 10 of the present invention are that there will be easily accessible ground planes by 28, 30 and transmission lines may be formed by etching processes in the metallic film layers 14, 16, 18. In addition, the insulating material 12 used in the present invention may be arbitrarily chosen as it is not subject to any constraints of compatibility for epitaxial growth of the semiconductor material which makes up the conductivity regions 20, 22, 24 used to fabricate the IMPATT diode 26. Therefore, the insulating material 12 can be chosen to be a material with good thermal conductivity properties as well as good low loss insulation properties such as beryllium oxide. This means that the IMPATT diode 26 constructed with the present invention will have very good power handling qualities and is not limited to low power applications. Obviously, these advantages of the quasi-monolithic integrated circuit structure 10 which have been shown in the IMPATT diode 26 may also be used advantageously in other electronic devices and circuits and are not limited only to microwave applications or to diode structures.

Figure 3:
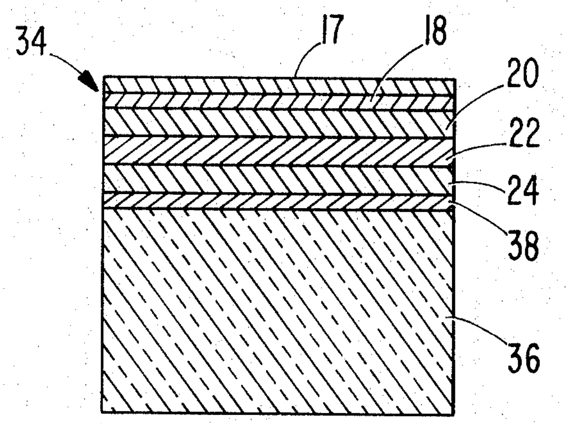
FIG. 3 is a sectional view of a metallized dielectric semiconductor substrate base.

To make a quasi-monolithic integrated circuit structure 10 according to the method of the present invention, one must first make a metallized dielectric semiconductor substrate base 34 as shown in FIG. 3. The substrate base 34 comprises a block of semiconductor material 36 upon which are formed a blocking layer 38 and conductivity regions 24, 22, 20. Although the blocking layer 38 is not necessary for the present invention, its use is shown in the preferred embodiment for reasons which will become obvious. The blocking layer 38 is relatively thin with respect to the semiconductor material 36. However, the doping composition of the blocking layer 38 is chosen to present a shield to the particular etchant which will be used on the semiconductor material 36. As will be seen, blocking layer 38 will then allow the semiconductor material 36 to be removed while providing protection for the conductivity regions 24, 22, 20 which it separates from the block of semiconductor material 36.

In the present invention, the semiconductor material 36 is not subject to any constraints other than being either silicon, germanium, a group III-V or II-VI compound, or some material which has an ability to support epitaxial growth, so the semiconductor material 36 may be chosen to be the same material as will be used for the conductivity regions. This means that either diffusion doping methods, epitaxial growth, or homoepitaxial growth, which ensures the greatest compatibility between the semiconductor material 36 and epitaxial layers grown thereon, may be used. Thus, if the blocking layer 38 and the conductivity layers 24, 22, 20 are to be epitaxially grown on silicon, the semiconductor material 36 will preferably also be silicon. If diffusion methods of doping are used, the blocking layer 38 and the conductivity regions 24, 22, 20 will preferably be of the same material, in this case, silicon, as the block of semiconductor material 36.

The blocking layer 38 and the regions 24, 22, 20 may be formed on the semiconductor material 36 by any of the techniques well known in the semiconductor art for forming regions of different conductivity types. For example, the blocking layer 38 and the conductivity regions 24, 22, 20 may be layers of the desired conductivity type which are sequentially epitaxially grown on the semiconductor material 36.

Alternatively, it may be desirable to form some of the conductivity regions by diffusion. In this case the blocking layer 38 may be epitaxially grown on the semiconductor material 36. Following the growth of the blocking layer 38, a P type region may be grown on the blocking layer 38. The P type region will be relatively thick as it will comprise three conductivity regions 24, 22, 20, following the diffusion of donor impurities. Donor impurities such as arsenic or antimony may be diffused into the surface of the thick P type layer which has been epitaxially grown on the blocking layer 38 in order to alter the conductivity of the thick P type layer so that only the lower region 24 remains P type and all regions closer to the surface will have an N type conductivity. Additional donor impurities such as those previously mentioned but of a higher concentration may be further diffused into the N type layer thus formed to alter the conductivity of that portion closest to the surface 20 so that there will be an N type layer 22 adjacent the P type layer 24 and an N+ type layer 20 above the N type layer 22. The techniques and conductivity modifiers used to form regions of different conductivity type by diffusion are well known in the semiconductor art.

As shown in FIG. 3, a metallic contact layer 17 is coated over the surface of the outer region 20 of the block of the semiconductor material 36. The contact layer 17 is of an electrically conductive metal which is relatively inert and which will not adversely affect the characteristics of the device formed on the semiconductor material 36. Preferably, the contact layer 17 is of gold or silver. Since it is difficult to achieve a strong mechanical bond between gold or silver and the semiconductor material of the block 36, an adherence or barrier layer 18 is provided between the surface of the uppermost conductivity region 20 and the contact layer 17. The adherence layer 18 is of an electrically conductive material which adheres well to the semiconductor material 36, makes good ohmic contact to the uppermost conductivity region 20, and provides a barrier to prevent diffusion of the gold or silver into the uppermost conductivity layer 20. As shown, the adherence or barrier layer 18 is a thin film of chromium coated on the surface of the outer region 20 of the block of semiconductor material 36.

The application of the chromium adherence layer 18 may be accomplished by the well known technique of vacuum evaporation. The gold contact layer 17 may be deposited on the outer surface of the chromium layer 18 by any of several well known methods such as by vacuum evaporation or by electroplating.

With the completion of the above steps, the fabrication of the metallized substrate base 34 shown in FIG. 3 is completed.

Figure 4:
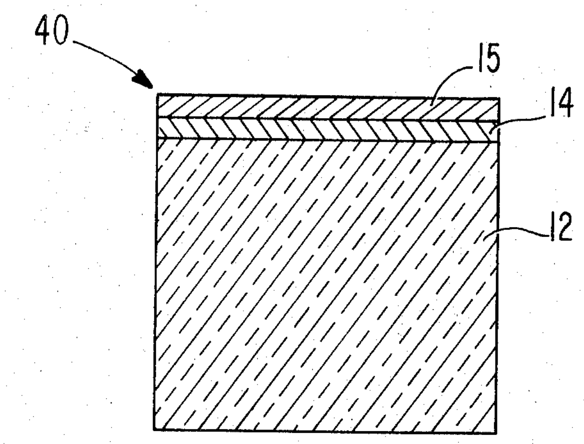
FIG. 4 is a sectional view of a metallized insulating substrate.

Referring now to FIG. 4, a metallized insulating substrate 40 which comprises an insulating substrate 12 and metallic layers 14, 15 is shown. The insulating substrate 12 may be arbitrarily chosen. In particular, the insulating substrate 12 does not have to be a material capable of epitaxial growth. The insulating substrate 12 may be chosen to have good low loss insulating properties as well as thermal conductivity. As already discussed, one example of such a material for use as an insulating substrate 12 is beryllium oxide. A block of insulating substrate material 12 such as beryllium oxide will have deposited thereon by any well known method, such as by vacuum deposition, a chromium adherence layer 14. Upon the chromium layer 14 will be deposited by any well known method, such as by vacuum deposition or by electroplating, a gold contact layer 15.

Figure 5:
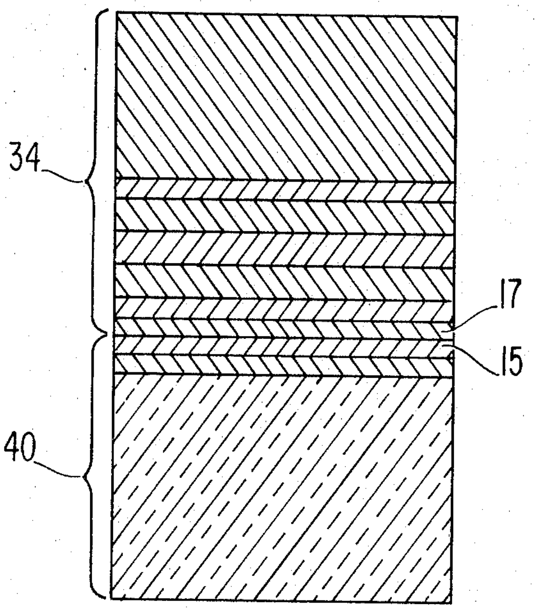
FIG. 5 is a sectional view of the metallized dielectric semiconductor substrate base of FIG. 3 and the metallized insulating substrate of FIG. 4 prior to thermobonding.
Figure 5A:
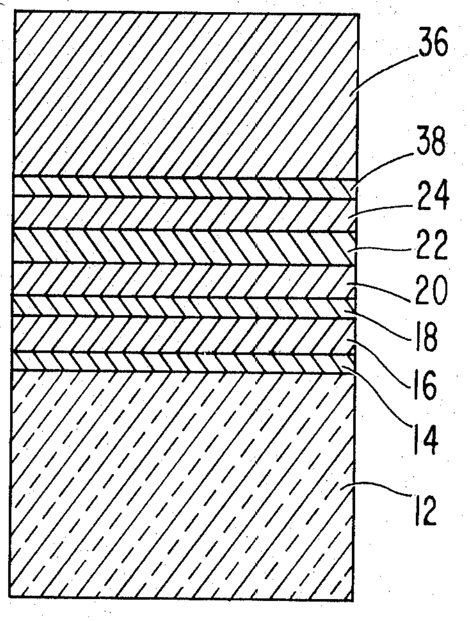
FIG. 5*a* is a sectional view of the metallized dielectric semiconductor substrate base of FIG. 3 and the metallized insulating substrate of FIG. 4 after thermobonding.

Referring now to FIG. 5, the metallized dielectric semiconductor substrate base 34 and the metallized insulating substrate 40 whose preparations have already been discussed, are shown to have been brought together with gold contact layer 17 of the metallized substrate base 34 juxtaposed directly above the gold contact layer 15 of the metallized insulating substrate layer 40. By a thermobonding process, a sufficient amount of heat and pressure is applied to the gold layers 15, 17 to bond them together, thereby forming a single gold layer 16 as shown in FIG. 5*a*. This bond can be achieved at a temperature of about 1,50°C under the application of a pressure of about 40,000 lbs./sq. in. for a period of about 5 minutes. Following the thermobonding, the insulating substrate 12 will provide a support for the metallic layers 14, 16, 18 and for the conductivity regions 20, 22, 24 which will make up the quasi-monolithic integrated circuit structure 10, so the semiconductor material 36, which was originally needed for support and for either epitaxial growth or diffusion, and the blocking layer 38 are no longer required. The semiconductor material 36 and the blocking layer 38 should be eliminated in order to yield free thermal flow from the conductivity regions 20, 22, 24. The removal of the semiconductor material 36 and the blocking layer 38 may be accomplished by any of several well known methods, including etching. In particular, various methods of selective etching may be used to remove the semiconductor material 36 up to the blocking layer 38 rapidly. These methods of selective etching may rely upon the chemical or physical properties doped into the blocking layer 38 when it was fabricated. For example, if blocking layer 38 is very lightly doped to make it highly resistive, an electrochemical etch might be used. A slow etching technique may then be used to remove the blocking layer 38 up to the surface of the P type conductivity region 24. This may be a chemical etch which can be easily controlled because the blocking layer 38 is made relatively thin with respect to the P type conductivity region 24.

Following the above steps, a quasi-monolithic integrated circuit structure 10 as shown in FIG. 1 will be provided.

While one use for the quasi-monolithic integrated circuit structure 10 of the present invention has been shown to be an IMPATT diode 26, other uses for the quasimonolithic integrated circuit structure 10 will become obvious to one skilled in the art.

I claim:

1. A method for making a quasi-monolithic integrated circuit structure which comprises the steps of:

a. growing at least one epitaxial conductivity region of a semiconductor material on a substrate of a semiconductor material;

b. depositing a first metallic layer on said epitaxial conductivity region;

c. depositing a second metallic layer upon a substrate of an insulating material;

d. bonding said first metallic layer to said second metallic layer; and e. removing portions of said conductivity regions in order to form isolated semiconductor devices interconnected by said bonded metallic layers.

2. The method of claim 1 having the additional step of removing portions of said bonded metallic layers in order to electrically separate said isolated semiconductor devices.

3. The method of claim 1 having the additional step of removing said substrate of semiconductor material.

4. The method of claim 3 wherein said step of removing said substrate of semiconductor material is accomplished by etching.

5. The method of claim 3 having an additional step of growing a blocking layer upon said substrate of semiconductor material prior to said step of growing said epitaxial conductivity regions upon said substrate of semiconductor material.

6. The method of claim 5 having the additional step of removing said blocking layer following said step of removing said substrate of semiconductor material.

7. The method of claim 1 having the additional step of diffusing at least one type of conductivity region into said semiconductor material following said step of growing at least one epitaxial conductivity region.

* * * * *